(12) United States Patent
Yamada et al.

(10) Patent No.: US 7,157,153 B2
(45) Date of Patent: Jan. 2, 2007

(54) SUPPORT AND ORGANIC ELECTROLUMINESCENCE ELEMENT COMPRISING THE SUPPORT

(75) Inventors: Taketoshi Yamada, Saitama (JP); Hiroshi Kita, Hachioji (JP)

(73) Assignee: Konica Corporation (JP)

( * ) Notice: Subject to any disclaimer, the term of this patent is extended or adjusted under 35 U.S.C. 154(b) by 258 days.

(21) Appl. No.: 10/387,956

(22) Filed: Mar. 13, 2003

(65) Prior Publication Data

US 2003/0189403 A1   Oct. 9, 2003

(30) Foreign Application Priority Data

Apr. 1, 2002   (JP) .............................. 2002-098204

(51) Int. Cl.
*B32B 9/00* (2006.01)
*H01L 33/00* (2006.01)

(52) U.S. Cl. .................. 428/688; 428/446; 428/698; 428/447; 428/690; 313/512

(58) Field of Classification Search ................ 428/690, 428/917, 688, 446, 698, 447; 313/512, 504
See application file for complete search history.

(56) References Cited

U.S. PATENT DOCUMENTS

| 6,165,566 A | * | 12/2000 | Tropsha ...................... 427/536 |
| 6,444,400 B1 | * | 9/2002 | Cloots et al. ............... 430/311 |
| 6,835,469 B1 | * | 12/2004 | Kwong et al. ............. 428/690 |
| 2002/0125831 A1 | * | 9/2002 | Inukai et al. ............. 315/169.3 |

FOREIGN PATENT DOCUMENTS

JP   10249990 A   *   9/1998

* cited by examiner

*Primary Examiner*—Dawn Garrett
(74) *Attorney, Agent, or Firm*—Cantor Colburn LLP

(57) ABSTRACT

Disclosed is a support which comprises a flexible substrate and provided thereon, one or two or more polymer layers and one or two or more sealing layers, wherein at least one of the polymer layers and the sealing layers is formed by a process comprising the steps of exciting a reactive gas at a space between opposed electrodes at atmospheric pressure or approximately atmospheric pressure by electric discharge to be in the plasma state, and exposing the flexible substrate, the polymer layer or the sealing layer to the reactive gas in the plasma state.

6 Claims, 5 Drawing Sheets

SUPPORT AND ORGANIC ELECTROLUMINESCENCE ELEMENT COMPRISING THE SUPPORT

FIELD OF THE INVENTION

This invention relates to a support with excellent moisture sealing ability and without layer exfoliation, which is useful for a display or an electronic device, and an organic electroluminescence element employing the support.

BACKGROUND OF THE INVENTION

A glass plate has been used in view of thermal stability or transparency, as a base plate of a display such as a liquid crystal display or an organic electroluminescence display or as a base plate of an electronic device such as CCD or a CMOS sensor.

In recent years, as portable information terminal units such as a cellular phone spread, use of a plastic substrate, which is flexible, light and difficult to be damaged, has been studied in place for a glass substrate, which is heavy or easy to be damaged, in a display or an electro-optical device provided in the terminal units.

However, since the plastic substrate has a moisture penetrability, it is difficult to be applied to a device such as an organic electroluminescence display (hereinafter referred to also as an organic electroluminescence element) which is damaged by moisture to cause deterioration of its performance. Accordingly, how to seal moisture is a problem.

In order to overcome the above problem, in WO-0036665 is proposed a layer (hereinafter referred to as proposed prior art) with a high moisture sealing ability, a composite layer employing silica with a low moisture penetrability and an acryl monomer, which is formed by depositing on a substrate a monomer containing an acryl monomer, polymerizing the deposited monomer, depositing silica, and further depositing a monomer containing an acryl monomer and polymerizing the deposited monomer. However, in this literature, concrete materials used or concrete experiment conditions are not disclosed. The present inventors have traced the proposed prior art, and as a result, they have found that the proposed prior art has problem in that the formed polymer layer and inorganic substance layer are likely to exfoliate during handling and moisture penetrates in the portions where the layers exfoliate.

SUMMARY OF THE INVENTION

Accordingly, an object of the invention is to provide a support with excellent moisture sealing ability and without layer exfoliation, which is useful for a display or an electronic device, and to provide an organic electroluminescence element with long life employing the support.

DETAILED DESCRIPTION OF THE INVENTION

Figure 1:
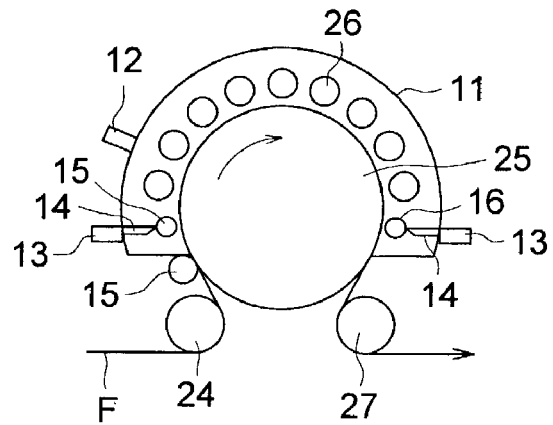
FIG. 1 shows one embodiment of a plasma discharge treatment chamber.
Figure 2:
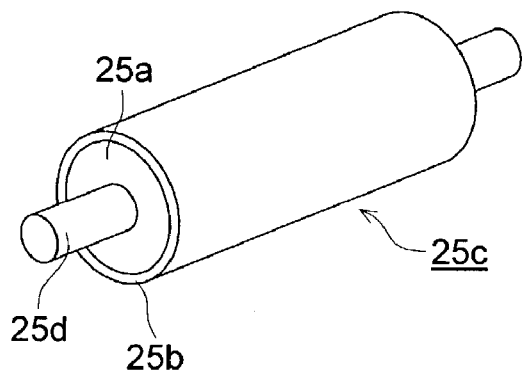
FIG. 2(a) and FIG. 2(b) show examples of roll electrode.
Figure 2:
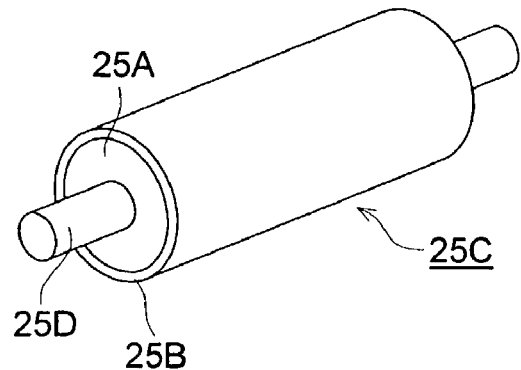
Figure 3:
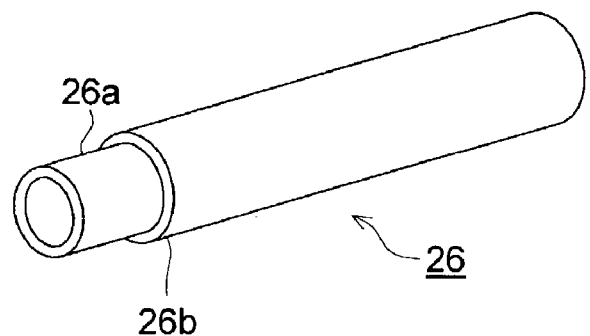
FIG. 3(a) and FIG. 3(b) show perspective views of fixed electrode.
Figure 3:
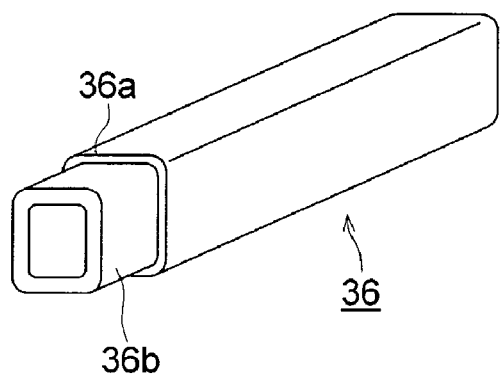

The object of the invention has been attained by the following constitutions:

1-1. A support comprising a flexible substrate and provided thereon, one or two or more polymer layers and one or two or more sealing layers, wherein at least one of the polymer layers and the sealing layers is formed by a process comprising the steps of exciting a reactive gas at a space between opposed electrodes at atmospheric pressure or approximately atmospheric pressure by electric discharge to be in the plasma state, and exposing the flexible substrate, the polymer layer or the sealing layer to the reactive gas in the plasma state.

1-2. The support of item 1-1 above, wherein the polymer layer contains a polymeric compound, and the sealing layer contains a metal oxide, a metal nitride or a metal oxide nitride.

1-3. The support of item 1-2 above, wherein the polymeric compound is obtained by polymerization of a monomer comprising a vinyl compound or an acetylene compound, the metal oxide is a compound selected from silicon oxide, titanium oxide, indium oxide, tin oxide, indium tin oxide (ITO), or alumina, the metal nitride is a compound selected from silicon nitride or titanium nitride, the metal oxide nitride is a compound selected from silicon oxide nitride, or titanium oxide nitride, and the reactive gas is an organometallic compound or the monomer.

1-4. The support of item 1-3 above, wherein the organometallic compound is an organosilicon compound, an organotitanium compound, an organotin compound, an organoindium compound, an organoaluminum compound, or a composite compound thereof.

1-5. The support of item 1-4 above, wherein the organosilicon compound is a compound represented by formula (1), (2), (3), or (4),

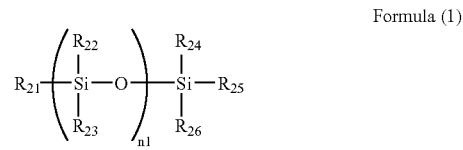

Formula (1)

wherein $R_{21}$, $R_{22}$, $R_{23}$, $R_{24}$, $R_{25}$, and $R_{26}$ independently represent a hydrogen atom or a monovalent substituent, and n1 represents a natural number.

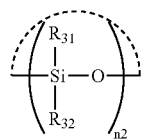

Formula (2)

wherein $R_{31}$ and $R_{32}$ independently represent a hydrogen atom or a monovalent substituent, and n2 represents a natural number.

$$(R_{41})_n Si(R_{42})_{(4-n)}$$ Formula (3)

wherein $R_{41}$ and $R_{42}$ independently represent a hydrogen atom or a monovalent substituent, and n represents an integer of from 0 to 3.

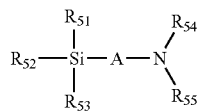

Formula (4)

wherein A represents a single bond or a divalent group, $R_{51}$, $R_{52}$, $R_{53}$, $R_{54}$, and $R_{55}$ independently represent a hydrogen atom, a halogen atom, an alkyl group, a cycloalkyl group, an alkenyl group, an aryl group, an aromatic heterocyclic group, an amino group or a cyano group, provided that $R_{51}$ and $R_{52}$, or $R_{54}$ and $R_{55}$ may combine with each other to form a ring.

1-6. The support of item 1-5 above, wherein the compound represented by formula (4) is a compound represented by formula (5),

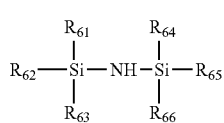

Formula (5)

wherein $R_{61}$, $R_{62}$, $R_{63}$, $R_{64}$, $R_{65}$, and $R_{66}$ independently represent a hydrogen atom, a halogen atom, an alkyl group, a cycloalkyl group, an alkenyl group, an aryl group, or an aromatic heterocyclic group.

1-7. The support of item 1-3 above, wherein the content of the metal oxide, the metal nitride and/or the metal oxide nitride in the sealing layer is not less than 90% by weight.

1-8. The support of claim 1-1 above, wherein the sealing layer contains carbon in an amount of from 0.2 to 5% by weight.

1-9. The support of item 1-1 above, wherein the sealing layer has a thickness of from 50 to 2000 nm, and the polymer layer has a thickness of from 50 to 2000 nm.

1-10. The support of item 1-1 above, wherein at least one of the sealing layers is formed by a process comprising the steps of exciting a reactive gas at a space between opposed electrodes at atmospheric pressure or approximately atmospheric pressure by discharge to be in the plasma state, and exposing the flexible substrate to the reactive gas in the plasma state.

1-11. The support of item 1-1 above, wherein the sealing layer is formed by a process comprising the steps of exciting a reactive gas at a space between opposed electrodes at atmospheric pressure or approximately atmospheric pressure by discharge to be in the plasma state, the discharge being induced by supply of a power of not less than 1 W/cm$^2$ with a frequency exceeding 100 kHz, and exposing the flexible substrate to the reactive gas in the plasma state.

1-12. An organic electroluminescence element comprising a support, wherein the support comprises a flexible substrate and provided thereon, one or two or more polymer layers and one or two or more sealing layers, wherein at least one of the polymer layers and the sealing layers is formed by a process comprising the steps of exciting a reactive gas at a space between opposed electrodes at atmospheric pressure or approximately atmospheric pressure by discharge to be in the plasma state, and exposing the flexible substrate to the reactive gas in the plasma state.

1-13. A support comprising a substrate and provided thereon, at least two layers containing a metal oxide, a metal nitride or a metal nitride oxide, the two layers being different in carbon concentration, wherein at least one of the layers is formed by a process comprising the steps of exciting a reactive gas at a space between opposed electrodes at atmospheric pressure or approximately atmospheric pressure by electric discharge to be in the plasma state, and exposing the substrate or the layer to the reactive gas in the plasma state.

2-1. A support comprising a flexible substrate and provided thereon, a polymer layer and a sealing layer, wherein at least one of the polymer layer and the sealing layer, is a layer formed by exciting a reactive gas at a space between opposed electrodes at atmospheric pressure or approximately atmospheric pressure by discharge to be in the plasma state, and exposing the flexible substrate to the reactive gas in the plasma state.

2-2. The support of item 2-1 above, wherein the polymer layer contains a polymeric compound, and the sealing layer contains a metal oxide, a metal nitride, or a metal oxide nitride.

2-3. The support of item 2-1 or 2-2 above, wherein the sealing layer is formed by discharge induced by supply of a power of not less than 1 W/cm$^2$ with a frequency exceeding 100 kHz.

2-4. An organic electroluminescence element comprising the support of any one of items 2-1 through 2-3.

The present inventors have made an extensive study, and as a result, they have developed a support having the constitution described above, which overcomes the above problem, and also developed an organic electroluminescence element (hereinafter referred to also as organic EL element) with a long life employing the support.

As described above, in recent years, use of a plastic substrate, which is flexible, light and difficult to be damaged, has been studied to replace a glass substrate, which is heavy or easy to be damaged, in crystal liquid or EL displays or electro-optical devices.

However, plastic substrates currently manufactured have relatively high moisture penetrability and contain some moisture. Therefore, the plastic substrates, when used in an organic electroluminescence display, have problem in that the moisture gradually diffuses in the display, and the diffused moisture lowers durability of the display.

In order to overcome the above problem, attempts have been made to obtain a support applicable to various electronic devices in which a plastic sheet is subjected to a certain treatment to minimize moisture penetrability or to reduce the moisture content. For example, in view of the above proposed prior art, an attempt has been made in which a thin layer of silica or glass with low moisture penetrability is formed on a plastic substrate to obtain a composite material. However, the thin layer has defects, and a specific layer thickness not less than a certain value is necessary to lower moisture penetrability and seal any moisture in the support.

When a layer containing silica or containing an inorganic material with low moisture penetrability such as a metal oxide, a metal nitride or a metal oxide nitride (in an amount of at least 90% by weight) is formed on a plastic substrate with a thickness sufficient to minimize moisture penetrability to obtain a support, the resulting support loses flexibility of the plastic substrate capable of being folded and causes layer exfoliation, which lowers moisture sealing ability.

Provision on a substrate of plural layers, not a single layer, helps to restrain layer exfoliation to some degree, which needs an extra process and increases manufacturing cost. Further, since it is essential to control physical properties of each layer, the plural layers are not necessarily preferable.

The invention is a support comprising a flexible substrate and provided thereon, a polymer layer and a sealing layer, wherein at least one of the polymer layer and the sealing layer, is a layer formed by exciting a reactive gas at a space between opposed electrodes at atmospheric pressure or approximately atmospheric pressure by discharge to be in the plasma state, and exposing the flexible substrate to the reactive gas in the plasma state. The present inventors have found that the support described above is a support with low moisture penetrability, reduced deterioration due to fold, and excellent moisture sealing ability and without layer exfoliation, and they have completed this invention.

The support of the invention is a support comprising a flexible substrate and provided thereon, a polymer layer and a sealing layer, wherein at least one of the polymer layer and the sealing layer is a layer formed according to plasma treating of the flexible substrate at atmospheric pressure or approximately atmospheric pressure, and preferably a support comprising a flexible substrate and provided thereon, a polymer layer and a sealing layer, wherein at least one of the sealing layers is a layer formed according to plasma treatment of the flexible substrate at atmospheric pressure or approximately atmospheric pressure. It is also preferred that the polymer layer is a layer formed according to plasma treatment of the flexible substrate at atmospheric pressure or approximately atmospheric pressure.

The sealing layer used in the invention will be explained below.

A metal oxide, a metal nitride and a metal oxide nitride are suitable for a material with low moisture penetrability. These form a relatively hard layer with high density.

A sealing layer comprising a metal oxide, a metal nitride or a metal oxide nitride can be obtained according to a method carrying out plasma treatment at atmospheric pressure or approximately atmospheric pressure, that is, an atmospheric pressure plasma method which comprises exciting a reactive gas, an organometallic compound between opposed electrodes to be in a plasma state, and exposing a substrate to the reactive gas in the plasma state to form the sealing layer on the substrate. Herein, atmospheric pressure or approximately atmospheric pressure herein referred to implies approximately atmospheric pressure, and typically a pressure of 20 kPa to 110 kPa, and preferably 93 kPa to 104 kPa.

The reactive gas used in the atmospheric pressure plasma method is preferably an organometallic compound. Flexibility of the sealing layer can be controlled by employing the organometallic compound as a reactive gas and by adjusting the plasma generation conditions. The carbon content of the sealing layer can be controlled adjusting the plasma generation conditions. Flexibility of the sealing layer varies depending on the carbon content of the layer.

Since particles such as ions from the reactive gas used are present between the opposed electrodes at a high concentration in the atmospheric plasma method, carbon derived from the organometallic compound used is likely to remain in the formed layer. A slight amount of carbon is preferably contained in the layer to provide flexibility to the layer and increase abrasion resistance of the layer. The carbon content of the layer is preferably from 0.2 to 5% by weight. When the carbon content exceeds 5% by weight, layer properties such as refractive index may change with time, which is not desirable.

In order to obtain a layer with a carbon content of from 0.2 to 5% by weight, discharge is preferably induced supplying a power of not less than 1 W/cm$^2$ with a frequency exceeding 100 kHz. Further, the waveform of a high frequency voltage applied is preferably a continuous sine wave.

The carbon content of the layer depends mainly on the frequency and power supplied from a power source, and decreases as frequency of voltage applied to electrodes is raised or power supplied is increased. When a hydrogen gas is incorporated in the mixed gas used, carbon atoms are likely to be consumed, and the carbon content can be controlled thereby also.

A sealing layer will be explained below, which is formed according to a plasma method carried out at atmospheric pressure or approximately atmospheric pressure, employing an organometallic compound as the reactive gas.

The substrate used in the invention may be any as long as it is flexible. The flexible substrate may be comprised of a single sheet, plural sheets or a sheet whose surface is subjected to subbing treatment. The flexible substrate preferably used is a resin substrate. Examples of the substrate include a polyester film such as a polyethylene terephthalate or polyethylene naphthalate film, a polyethylene film, a polypropylene film, a cellophane film, a film of a cellulose ester such as cellulose diacetate, cellulose triacetate, cellulose acetate butyrate, cellulose acetate propionate, cellulose acetate phthalate, cellulose nitrate or their derivative, a polyvinylidene chloride film, a polyvinyl alcohol film, an ethylene-vinyl alcohol film, a syndiotactic polystyrene film, a polycarbonate film, a norbornene resin film, a polymethylpentene film, a polyetherketone film, a polyimide film, a polyethersulfone film, a polysulfone film, a polyetherketoneimide film, a polyamide film, a fluorine-containing resin film, a nylon film, a polymethyl methacrylate film, an acryl film, and a polyarylate film. A cyclopolyolefin resin such as ARTON (produced by JSR Co., Ltd.) or APEL produced by Mitsui Kagaku Co., Ltd.) can be preferably used. The thickness of the substrate is preferably from 30 μm to 1 cm, and more preferably from 50 μm to 1000 μm.

The layer containing the metal oxide, metal nitride or metal oxide nitride described above as a main component refers to a layer containing the metal oxide, metal nitride or metal oxide nitride in an amount of not less than 50% by weight.

Examples of the metal oxide include silicon oxide, titanium oxide, indium oxide, tin oxide, indium tin oxide (ITO), and alumina. Examples of the metal nitride include titanium nitride and silicon nitride. Examples of the metal oxide nitride include silicon oxide nitride, and titanium oxide nitride.

The silicon oxide is highly transparent, but has a poor gas barrier property and a moisture penetrating property. It is preferred that the silicon oxide layer preferably contains a nitrogen atom. The silicon oxide nitride and titanium oxide nitride are represented by SiOxNy and TiOxNy, respectively. When the nitrogen content in a layer is increased, the gas barrier property is enhanced, but light transmittance is lowered. When high light transmittance is necessary for the support, x and y preferably satisfy the following relationship:

$$0.4 \leq x/(x+y) \leq 0.8$$

The oxygen atom or nitrogen atom content can be measured employing XPS (ESCA LAB-200R produced by VIEWING ANGLE Scientific Co., Ltd. in the same manner as a carbon atom content described later.

In the invention, the main component of the sealing layer is preferably an oxide of aluminum, silicon, or titanium or an oxide nitride of silicon, or titanium, in view of low moisture penetrability. In the invention, when plural layers containing a metal oxide, a metal oxide nitride or a metal nitride are formed, at least one of the layers has a carbon content of from 1 to 40 atomic %. When plural layers containing a metal oxide, a metal oxide nitride or a metal nitride are formed, the plural layers are preferably those containing the same metal oxide, the same metal oxide nitride, or the same metal nitride but having a different carbon content.

As the organotin compound, organosilicon compound or organotitanium compound described above, a metal hydride compound or a metal alkoxide compound is preferably used in view of handling, and the metal alkoxide compound is more preferably used, since it is not corrosive, and generates no harmful gas nor causes contamination. When the organotin compound, organosilicon compound or organotitanium compound described above is introduced into a discharge space or a space between the electrodes. As the reactive gas for forming the sealing layer, an organometallic compound and a metal hydride compound can be used. The compounds may be in the form of gas, liquid, or solid at ordinary temperature and ordinary pressure. When they are gas at ordinary temperature and ordinary pressure, they can be introduced in the discharge space as they are. When they are liquid or solid, they are gasified by heating, or under reduced pressure or ultrasonic wave radiation, and used. The above compound may be diluted with another solvent. The solvents include an organic solvent such as methanol, ethanol, n-hexane or a mixture thereof. Since these solvents are decomposed during discharge plasma treatment, their influence on the layer formed on the substrate can be neglected.

A compound represented by formulae (1) through (4) described below is preferred as the organometallic compound for forming a silicon oxide layer, since it is not corrosive, and generates no harmful gas nor causes contamination.

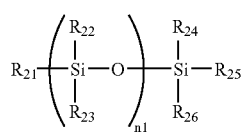

Formula (1)

wherein $R_{21}$ through $R_{26}$ independently represent a hydrogen atom or a monovalent substituent, and n1 represents a natural number.

Examples of the compound represented by formula (1) include hexamethyldisiloxane (HMDSO), tetramethyldisiloxane (TMDSO), and 1,1,3,3,5,5-hexamethyltrisiloxane.

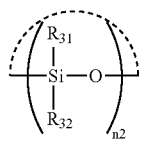

Formula (2)

wherein $R_{31}$ and $R_{32}$ independently represent a hydrogen atom or a monovalent substituent, and n2 represents a natural number.

Examples of the compound represented by formula (2) include hexamethylcyclotetrasiloxane, octamethylcyclotetrasiloxane, and decamethylcyclopentanesiloxane.

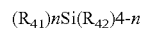

Formula (3)

wherein $R_{41}$ and $R_{42}$ independently represent a hydrogen atom or a monovalent substituent, and n represents an integer of from 0 to 3.

Examples of the organic compound represented by formula (3) include tetraethoxysilane (TEOS), methyltrimethoxysilane, methyltriethoxysilane, dimethyldimethoxysilane, dimethyldiethoxysilane, trimethylethoxysilane, ethyltrimethoxysilane, ethyltriethoxysilane, n-propyltrimethoxysilane, n-propyltriethoxysilane, n-butyltrimethoxysilane, i-butyltrimethoxysilane, n-hexyltrimethoxysilane, phenyltrimethoxysilane, vinyltrimethoxysilane, and vinyltriethoxysilane.

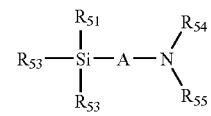

Formula (4)

wherein A represents a single bond or a divalent group, $R_{51}$ through $R_{55}$ independently represent a hydrogen atom, a halogen atom, an alkyl group, a cycloalkyl group, an alkenyl group, an aryl group, an aromatic heterocyclic group, an amino group or a cyano group, provided that $R_{51}$ and $R_{52}$ or $R_{54}$ and $R_{55}$ may combine with each other to form a ring.

In formula (4), A is preferably a single bond or a divalent group having a carbon atom number of 1 to 3. $R_{54}$ and $R_{55}$ may combine with each other to form a ring, and examples of the formed ring include a pyrrole ring, a piperidine ring, a piperazine ring, and an imidazole ring. It is preferred that $R_{51}$ through $R_{53}$ independently represent a hydrogen atom, a methyl group or an amino group.

Examples of the organic compound represented by formula (4) include aminomethyltrimethylsilane, dimethyldimethylaminosilane, dimethylaminotrimethylsilane, allylaminotrimethylsilane, diethylaminodimethylsilane, 1-trimethylsilylpyrrole, 1-trimethylsilylpyrrolidine, isopropylaminomethyltrimethylsilane, diethylaminotrimethylsilane, anilinotrimethylsilane, 2-piperidinoethyltrimethylsilane, 3-butylaminopropyltrimethylsilane, 3-piperidinopropyltrimethylsilane, bis(dimethylamino)methylsilane, 1-trimethylsilylimidazole, bis(ethylamino)dimethylsilane, bis(butylamino)dimethylsilane, 2-aminoethylaminomethyldimethylphenylsilane, 3-(4-methylpiperazinopropyl) trimethylsilane, dimethylphenylpiperazinomethylsilane, butyldimethyl-3-piperazinopropylsilane, dianilinodimethylsilane, and bis(dimethylamino)diphenylsilane.

A compound represented by formula (4) is preferably a compound represented by formula (5).

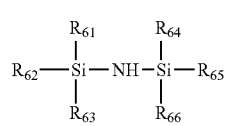

Formula (5)

wherein $R_{61}$ through $R_{66}$ independently represent a hydrogen atom, a halogen atom, an alkyl group, a cycloalkyl group, an alkenyl group, an aryl group, or an aromatic heterocyclic group.

In formula (5), it is preferred that $R_{61}$ through $R_{66}$ independently represent a hydrocarbon group having a carbon atom number of 1 through 10, in view of easy gasification, and it is more preferred that at least two of $R_{61}$ through $R_{63}$ are methyl groups and at least two of $R_{64}$ through $R_{66}$ are methyl groups.

Examples of the organic compound represented by formula (5) include 1,1,3,3-tetramethyldisilazane, 1,3-bis(chloromethyl)-1,1,3,3-tetramethyldisilazane, hexamethyldisilazane, and 1,3-divinyl-1,1,3,3-tetramethyldisilazane.

In order to form a tin oxide layer, for example, dibutyltin diacetate is used. Further, in order to form an aluminum oxide layer, for example, aluminum isopropoxide or tris(2,4-pentadionato)aluminum is used. In order to form a titanium oxide layer, for example, titanium tetraisopropoxide is used.

Employing a mixed gas of an oxygen gas or a nitrogen gas in a specific amount and the above organometallic compound, a layer containing a metal atom such as silicon or tin and at least one of a nitrogen atom and an oxygen atom.

In order to adjust a carbon content of the formed layer, a hydrogen gas may be further mixed in the mixed gas described above. A mixed gas in which inert gas belonging to a group XVIII of periodic table such as helium, neon, argon, krypton, xenon, or radon, preferably helium or argon, is mixed in the reactive gas is introduced in the atmospheric pressure plasma discharge generating apparatus (plasma generating apparatus) to form a layer. The content ratio of the inert gas to the reactive gas in the mixed gas used is 90.0 to 99.9% by volume, although it differs due to properties of a layer formed.

The above-described mixed gas for forming a layer containing a specific amount of for example, Si, O, N, and C will be explained below.

Explanation will be made regarding a silicon oxide nitride layer to have been formed employing a mixed gas of silazane and oxygen gas, in which x/(x+y) is not more than 0.8, and contains carbon in an amount of for example, 0.2 to 5% by weight. In this case, The Si and N in the layer is derived from silazane.

The oxygen gas content of the mixed gas is preferably from 0.01 to 5% by volume, and more preferably from 0.05 to 1% by volume. Considering reaction efficiency of oxygen gas and silazane, the content ratio (by mole) of oxygen gas to silazane in the mixed gas is set so that it is 1 to 4 times the content ratio in the layer formed. Thus, the oxygen gas content and the content ratio of the oxygen gas to the silazane are determined.

In forming a Si and N containing layer from silazane without using oxygen, the content of gasified silazane in the mixed gas may be from 0.2 to 1.5% by volume. Since a considerable amount of carbon remains in the layer, a part of the carbon is removed, employing a mixed gas containing a hydrogen gas in an amount of at most 2% by volume.

Besides the organosilicon compound, an inorganic silicon compound can be also used as the Si providing source.

As the oxygen providing source, ozone, carbon dioxide, or water (steam) may be used, besides an oxygen gas. As the nitrogen providing source, ammonia or nitrogen oxides may be used, besides silazane or a nitrogen gas.

The plasma layer formation apparatus used in the formation of the layer in the invention will be explained employing FIGS. 1 to 6. In the figures, a substrate F is a long-length film used as one example of a substrate.

In the invention, the discharge plasma treatment preferably used is carried out at atmospheric pressure or at approximately atmospheric pressure. Herein, approximately atmospheric pressure herein referred to implies a pressure of 20 kPa to 110 kPa, and preferably 93 kPa to 104 kPa.

FIG. 1 shows one embodiment of a plasma discharge treatment chamber in the plasma layer formation apparatus. In the plasma discharge treatment chamber 10 of FIG. 1, substrate F in the film form is transported while wound around roll electrode 25 rotating in the transport direction (clockwise in FIG. 1). Plural fixed electrodes 26, which are fixed around roll electrode 25, are in the form of cylinder and opposed to the roll electrode 25.

The plasma discharge vessel 11, constituting the plasma discharge treatment chamber 10, is preferably a vessel of pyrex (R) glass, but a vessel of metal may be used if insulation from the electrodes is secured. For example, the vessel may be a vessel of aluminum or stainless steel laminated with a polyimide resin or a vessel of the metal which is thermally sprayed with ceramic to form an insulation layer on the surface.

The substrate F, which has been wound around the roll electrode 25, is pressed with nip rollers 15 and 16, transported into a discharge space in the plasma discharge vessel 11 through guide roller 24, subjected to discharge plasma treatment, and then transported into the next process through guide roller 27. Since discharge treatment in the invention can be carried out at atmospheric pressure or approximately atmospheric pressure but not under vacuum condition, continuous treatment as described above is possible, which can provide high productive efficiency.

Blade 14 is provided at the vicinity of the nip rollers 15 and 16, and prevents air accompanying the transported substrate F from entering the plasma discharge vessel 11. The volume of the accompanying air is preferably not more than 1% by volume and more preferably not more than 0.1% by volume, based on the total volume of air in the plasma discharge vessel 11, which can be attained by the nip rollers 15 and 16 above.

A mixed gas used in the discharge plasma treatment is introduced into the plasma discharge vessel 11 from supply port 12, and exhausted from exhaust port 13 after discharge treatment.

Roll electrode 25 is a ground electrode, and opposed to voltage application electrodes, plural fixed electrodes 26. Discharge is induced at a space between the roll electrode and the fixed electrodes, the reactive gas supplied to the space is excited by the discharge to be in the state of plasma, and a long length substrate transported onto the roll electrode 25 is exposed to the reactive gas in the plasma state to form a layer resulting from the reactive gas on the substrate.

It is preferred that a layer formation rate be increased by high plasma density between the opposed electrodes, and high electric power with a high frequency be supplied in order to control the carbon content of the layer formed.

Typically, a high frequency voltage with a frequency of from 100 kHz to 150 MHz and preferably not less than 200 kHz is preferably supplied. The power supplied across the space between the opposed electrodes is preferably from 1 to 50 W/cm$^2$, and more preferably not less than 2 W/cm$^2$.

The electrode surface area (cm$^2$) to which voltage is applied refers to the surface area of the electrode at which discharge occurs.

The high frequency voltage applied to the electrodes may be a continuous sine wave or a discontinuous pulsed wave. The sine wave is preferred in providing high layer formation speed.

Such electrodes are preferably those in which a dielectric is coated on the surface of a metal base material. A dielectric is coated on at least one of fixed electrodes 26 and a roll electrode 25 opposed to each other, and preferably on both electrodes. The dielectric is preferably an inorganic compound having a dielectric constant of from 6 to 45.

When one of the electrodes 25 and 26 has a dielectric layer, the minimum space distance between the electrode and the dielectric layer is preferably from 0.5 to 20 mm, and more preferably in the range of 1 mm±0.5 mm, and when both electrodes described above have a dielectric layer, the minimum space distance between both dielectric layers is preferably from 0.5 to 20 mm, and more preferably in the range of 1 mm±0.5 mm, in carrying out uniform discharge. The space distance between the opposed electrodes is determined considering thickness of a dielectric layer provided on the conductive metal base material, or applied voltage level.

When a flexible substrate placed or transported between the electrodes is exposed to plasma, employing as one of the electrodes a roll electrode capable of transporting the substrate while directly contacting the roll electrode and surface-finishing the dielectric layer of the dielectric coated electrode by polishing treatment so as to obtain a surface roughness Rmax (according to JIS B 0601) of not more than 10 μm, the dielectric layer thickness or the gap between the electrodes can be maintained constant, and stable discharge can be carried out. Further, coverage of non-porous inorganic dielectric layer with high precision and without strain or cracks due to thermal shrinkage difference or residual stress can provide an electrode with greatly increased durability.

In preparing a dielectric coated electrode by coating a dielectric layer on a metal base material, it is necessary that the dielectric layer surface be surface finished by polishing treatment as described above and the difference in thermal expansion between the dielectric layer and the metal base material be reduced. Accordingly, a metal base material is preferably lined with an inorganic material layer, in which the foam content is controlled, as a stress absorbing layer. The inorganic material for lining is preferably glass produced according to a melting method, which is known as enamel etc. It is preferred that the foam content of the lowest layer which contacts the conductive metal base material is 20 to 30% by volume, and the foam content of the layer or layers provided on the lowest layer is not more than 5% by volume, which provides a good electrode with high density and without cracks.

Another preferred method for coating a dielectric on a metal base material is a method in which a ceramic is thermally splayed on the metal base material to form a ceramic layer with a void content of not more than 10% by volume, and sealed with an inorganic material capable of being hardened by a sol-gel reaction. In order to accelerate the sol gel reaction, heat hardening or UV irradiation is preferably carried out. Sealing treatment, in which coating of diluted sealing solution and hardening are alternately repeated several times, provides an electrode with improved inorganic property, with high density and without any deterioration.

FIG. 2(a) and FIG. 2(b) show roll electrode 25c and roll electrode 25C, respectively, as examples of roll electrode 25.

As is shown in FIG. 2(a), roll electrode 25c, which is a ground electrode, is an electrode in which a conductive base roll 25a such as a metal roll is coated with ceramic to form a ceramic dielectric layer 25b as a dielectric layer, the coating being carried out by thermally spraying ceramic on the base roll to form a ceramic layer, and sealing the ceramic layer with sealing materials such as inorganic compounds. The roll electrode is prepared to have a ceramic dielectric layer with a thickness of 1 mm and a roll diameter of 200ϕ, and is grounded. The ceramic material used for thermal spraying is preferably alumina, silicon nitride, and more preferably alumina in view of easy processability.

Further, as is shown in the roll electrode 25C of FIG. 2(b), the roll electrode may be an electrode in which a conductive base roll 25A such as a metal roll is lining coated with inorganic materials to form a lined dielectric layer 25B as a dielectric layer. Materials for lining are preferably silicate glass, borate glass, phosphate glass, germanate glass, tellurite glass, aluminate glass, and vanadate glass. Among these, borate glass is more preferably used in view of easy processability.

Examples of a metal used in the conductive metal base roll 25a or 25A include metals such as silver, platinum, stainless steel, aluminum, and iron. Stainless steel is preferable in view of processability.

In one embodiment carried out in the invention, a base roll for the roll electrode employs a stainless steel jacket roll having therein a cooling means (not illustrated in the Figs.) employing chilled water.

The roll electrodes 25c and 25C (similarly, roll electrode 25) are set to rotate around the axes 25d and 25D, respectively, by a driving system not illustrated.

FIG. 3(a) shows a perspective view of fixed electrode 26. The fixed electrode is not limited to a cylindrical form, an may be in the prismatic form as shown in fixed electrode 36 of FIG. 3(b). The prismatic electrode has a discharge area larger than the cylindrical electrode 26, and is preferably used according to properties of the layer formed.

The fixed electrodes 26 and 36 have the same constitution as that of the roll electrode 25c or 25C described above. That is, in the same manner as in roll electrode 25 (25c and 25C) above, dielectric layers 26b and 36b are coated on hollow stainless steel pipes 26a and 36a, respectively, and the resulting electrodes are constructed so as to be cooled with chilled water during discharge. The dielectric layers 26b and 36b may be a layer formed by ceramic thermal spraying or a layer formed by lining.

In an example as shown in FIG. 1, fixed electrodes having a dielectric layer are prepared to give a roll diameter of 12ϕ or 15ϕ, and fourteen of the fixed electrodes are arranged around the circumference of the roll electrode described above.

Figure 4:
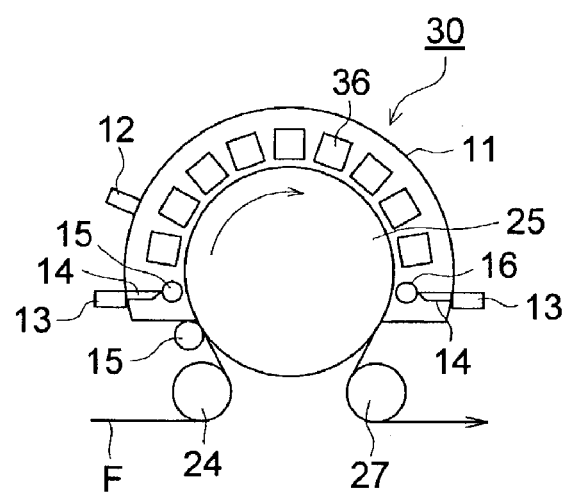
FIG. 4 shows a plasma discharge chamber in which the fixed prismatic electrodes are arranged around the circumference of the roll electrode.

FIG. 4 shows a plasma discharge chamber 30 in which the fixed prismatic electrode 36 as shown in FIG. 3(b) is arranged around the circumference of the roll electrode 25. The numerical numbers shown in FIG. 4 mean the same as denoted in FIG. 1.

Figure 5:
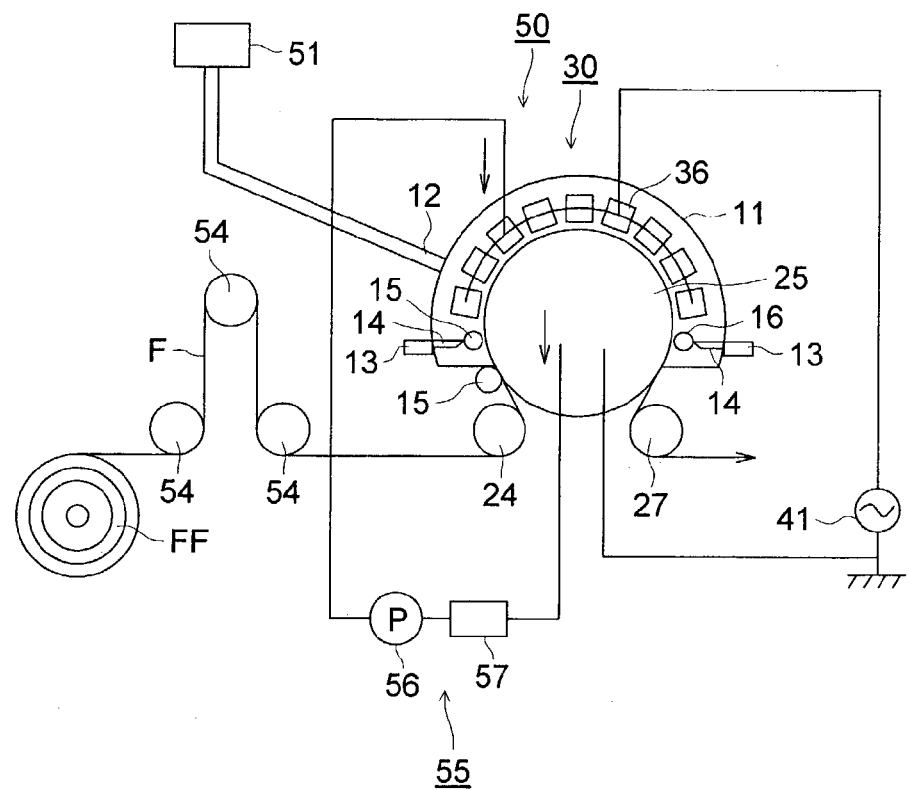
FIG. 5 shows a schematic view of one embodiment of the plasma layer formation apparatus.

FIG. 5 shows a schematic view of one embodiment of the plasma layer formation apparatus used in the invention. In FIG. 5, the plasma layer formation apparatus 50 is equipped with plasma discharge chamber 30 shown in FIG. 4. In the plasma layer formation apparatus 50, a gas generating device 51, a power source 41, and an electrode cooling device 55 and so on are further provided in addition to plasma discharge chamber 30. The electrode cooling device 55 is comprised of a tank 57 containing a cooling agent and a pump 56. As the cooling agent, insulating materials such as distilled water and oil are used. The gap distance between the opposed electrodes in the plasma discharge chamber 30 shown in FIG. 5 is, for example, approximately 1 mm.

A mixed gas generated in the gas generating device 51 is introduced from supply port 12 in a controlled amount into the plasma discharge chamber 30, in which roll electrode 25 and fixed electrode 36 are arranged at a predetermined position, whereby the plasma discharge vessel 11 is charged with the mixed gas, and thereafter, the unnecessary gas is exhausted from the exhaust port 13.

Subsequently, the roll electrode 25 being grounded, voltage is applied to electrodes 36 by power source 41 to generate discharge plasma. A flexible substrate F is supplied from stock roll FF through rolls 54, and transported to a gap between the electrodes in the plasma discharge chamber 30 through guide roller 24 so that the one side of the substrate contacts the surface of the roll electrode 25. During transporting, the flexible substrate F is subjected to discharge plasma treatment, and then transported to the next processing through guide roller 27. In the above, only the surface of the flexible substrate F opposite the surface contacting the roll electrode is subjected to discharge treatment.

In order to minimize an adverse effect due to high temperature during the discharge plasma treatment, the substrate temperature is cooled to a temperature of preferably from ordinary temperature (15 to 25° C.) to less than 200° C., and more preferably from ordinary temperature to 100° C., optionally employing an electrode cooling means 55. Numerical numbers 14, 15 and 16 mean the same as in FIG. 1.

Figure 6:
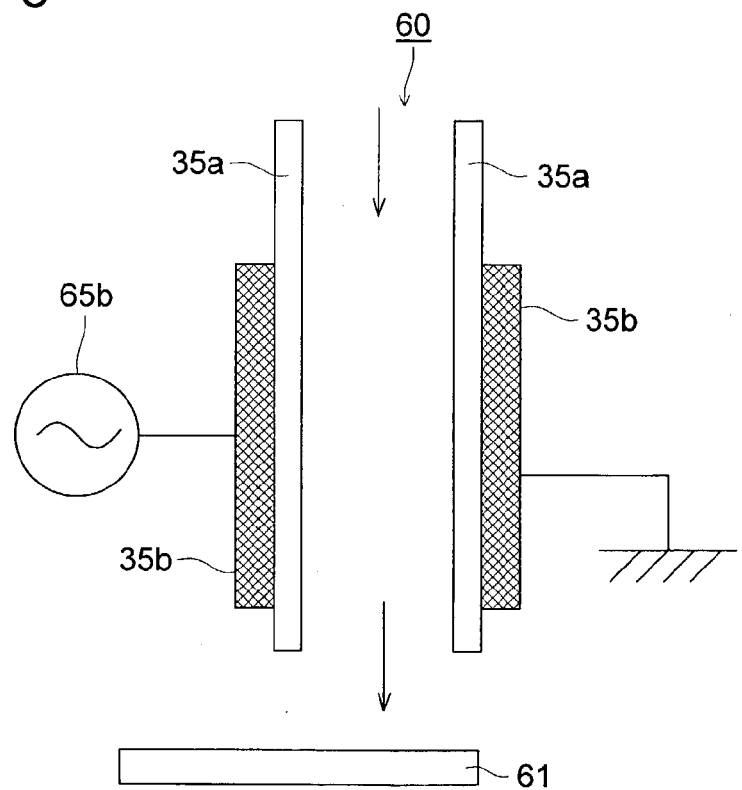
FIG. 6 shows a schematic view of another plasma layer formation apparatus.

FIG. 6 shows a schematic view of a plasma layer formation apparatus 60 used in the invention. The plasma layer formation apparatus 60 is used when a layer is formed on a substrate which cannot be provided at the space between the opposed electrodes, for example, a substrate 61 having a great thickness, wherein a reactive gas to have been in a plasma state is jetted onto the substrate to form a layer on the substrate.

In the plasma layer formation apparatus 60 of FIG. 6, numerical numbers 35a, 35b and 65 represents a dielectric layer, a metal base material, and a power source, respectively. A mixed gas comprised of a reactive gas and inert gas is introduced into a slit formed between the opposed electrodes in which a dielectric layer 35a is coated with a metal base material 35b. The introduced reactive gas is excited to a plasma state by applying voltage to the electrodes, and the gas in the plasma state is jetted onto the substrate 61 to form a layer on the substrate 61.

Power source 41 of FIG. 5 or power source 65 of FIG. 6, which is used for forming the layer in the invention, is not specifically limited. As the power sources, impulse high frequency power source (continuous mode, 100 kHz) produced by Heiden Kenkyusho, a high frequency power source (200 kHz) produced by Pearl Kogyo Co., Ltd., a high frequency power source (800 kHz) produced by Pearl Kogyo Co., Ltd., a high frequency power source (13.56 MHz) produced by Nippon Denshi Co., Ltd., and a high frequency power source (150 MHz) produced by Pearl Kogyo Co., Ltd. can be used.

The sealing layer and/or polymer layer in the invention can be formed according to the atmospheric pressure plasma method, employing the plasma layer formation apparatus as described above.

The polymer layer contains a polymeric compound as a main component. The polymeric compound is obtained by polymerization of a monomer comprising a vinyl compound or an acetylene compound. When the polymer layer in the invention is formed according to the atmospheric pressure plasma method, a vinyl compound having a vinyl group or an acetylene compound having an acetylenyl group is preferably used as a reactive gas. Examples of the vinyl compound having a vinyl group or the acetylene compound acetylenyl group include methyl methacrylate, ethyl acrylate, vinyl acetate, styrene, iso-propyl vinyl ether, and acetylene. When the polymer layer is formed, these compounds can be plasma treated under layer formation conditions such that they are polymerized without being decomposed. The frequency of the power source is preferably from 3 to 150 MHz.

The thickness of the sealing layer in the invention can be adjusted, increasing the plasma treatment time, or repeating plasma treatment. The layer thickness capable of substantially preventing moisture from penetrating in the layer is preferably not less than 50 nm, and more preferably not less than 100 nm. The thick sealing layer provides an excellent moisture resistance, but since a too thick sealing layer shows low stress relaxation, the thickness thereof is preferably not more than 2000 nm. When plural sealing layers are formed, it is preferred that each sealing layer have the thickness range defined above.

The thickness of the polymer layer in the invention is preferably from 50 to 2000 nm, and more preferably from 100 to 1000 nm, in that the sealing layer does not peel from the substrate or has good stress relaxation. When plural polymer layers are formed, it is preferred that each polymer layer have the thickness range defined above.

The support of the invention comprising the sealing layer and the polymer layer will be explained below.

The support of the invention comprises a resin substrate, and provided thereon, a sealing layer having a thickness of preferably not less than 100 nm, and more preferably not less than 200 nm, and a polymer layer adjacent to the sealing layer in that order. When the support is folded, the sealing layer is likely to peel off from the substrate, however, stress relaxation of the polymer layer prevents the sealing layer from peeling off. Further, the polymer layer can provide low moisture penetration.

Figure 7:
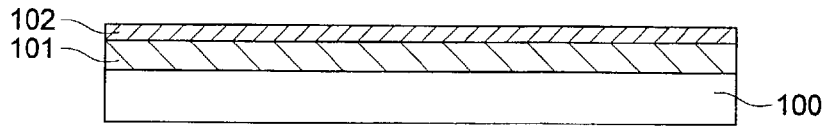
FIG. 7 shows a sectional view of one embodiment of the support of the invention.

FIG. 7 shows a sectional view of the support comprising the layer structure described above. The support has a resin substrate 100, and provided thereon, a sealing layer 101 and a polymer layer 102 in that order, the polymer layer being adjacent to the sealing layer. The thickness of both layers may be the same or different.

The preferred embodiment of the invention is a support in which the polymer layer 102 are provided closer to the substrate 100 than the sealing layer 101, wherein the polymer layer substantially prevents moisture from penetrating into the layer, and increases adhesion of the sealing layer 101, which provides a moisture sealing property to the support, to the substrate.

Figure 8:
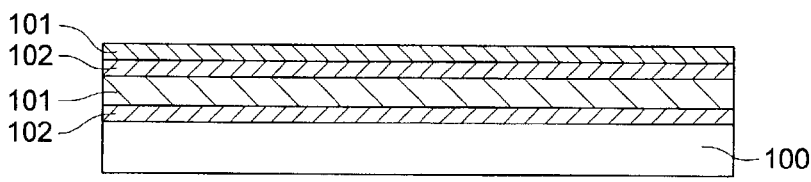
FIG. 8 shows a sectional view of another embodiment of the support of the invention.

FIG. 8 shows a sectional view of one embodiment of the support having two or more of the layer structure described above. The support has a resin substrate 100, and provided thereon, a sealing layer 101, a polymer layer 102, a sealing layer 101, and a polymer layer 102 in that order. The two sealing layers 101 and the two polymer layers 102 need not have the same composition or the same layer thickness, respectively. In order to obtain the support having such plural layer structures according to the atmospheric plasma method, the substrate can be plasma treated in the plasma layer formation apparatus described above several times.

The support of the invention, even when a resin substrate is used as a flexible substrate, can not only maintain the flexibility which the flexible resin has, but can seal moisture contained in the resin substrate or water vapor penetrating in the resin substrate due to a water sealing property which the sealing layer has. Accordingly, since the sealed inner space of the display can maintain the humidity to be low, a flexible display prepared by forming an organic electroluminescence (EL) element on such a support and sealing it with a flexible material such as a film, preferably the same support as above, can solve problem that properties of the organic electroluminescence element which is sensitive to moisture gradually degrade due to the moisture contained in a sealing agent or the support, which greatly lengthen its life.

In the invention, at least one of laminated layers comprising a polymer layer and a sealing layer is formed by an atmospheric pressure plasma method. The layer formation methods in the invention include a method in which all the layers are formed by an atmospheric pressure plasma method, and a method in which the sealing layer is formed by an atmospheric pressure plasma method, and a polymer layer is formed by a vacuum deposition method or other layer formation methods.

The other layer formation methods above are may be any methods including a sol gel method in which a coating solution is coated, a vacuum deposition method, a sputtering method, and a CVD method (chemical deposition).

The organic electroluminescence element of the invention, employing the support of the invention, will be detailed below.

In the invention, the organic electroluminescence element has a structure in which a light emission layer is provided between a pair of electrodes, an anode and a cathode. The light emission layer herein broadly refers to a layer emitting light when electric current is supplied to the electrode comprised of the cathode and the anode. Typically, the light emission layer is a layer containing an organic compound emitting light when electric current is supplied to an electrode comprised of a cathode and an anode.

The organic EL element of the invention has a structure in which a hole injecting layer, an electron injecting layer, a hole transporting layer, and an electron transporting layer, in addition to the light emission layer, are optionally provided between the cathode and the anode. Further, the organic EL element may have a protective layer.

In concrete, the following structures are included.

(i) Anode/Light emission layer/Cathode
(ii) Anode/Hole injecting layer/Light emission layer/Cathode
(iii) Anode/Light emission layer/Electron injecting layer/Cathode
(iv) Anode/Hole injecting layer/Light emission layer/Electron injecting layer/Cathode
(v) Anode/Hole injecting layer/Hole transporting layer/Light emission layer/Electron transporting layer/Electron injecting layer/Cathode Further, a cathode buffering layer (for example, a lithium fluoride layer) may be inserted between the electron injecting layer and the cathode, and an anode buffering layer (for example, a copper phthalocyanine layer) may be inserted between the hole injecting layer and the anode.

The light emission layer may comprise a hole injecting layer, an electron injecting layer, a hole transporting layer, or an electron transporting layer. That is, the light emission layer may have at least one of the following functions: (1) an injecting function capable of injecting holes from an anode or a hole injecting layer and injecting electrons from a cathode or an electron injecting layer by application of electric field, (2) a transporting function capable of transporting the injected charges (holes and electrons) by application of electric field, and (3) an emission function capable of providing the field of recombination of holes and electrons which leads to light emission. In the above case, apart from the light emission layer, at least one of the hole injecting layer, the electron injecting layer, the hole transporting layer, and the electron transporting layer is not necessary. Further, a hole injecting layer, an electron injecting layer, a hole transporting layer, and an electron transporting layer being added with a light emission compound, they may be given a function of a light emission layer. In the light emission layer, ease with which holes are injected may be different from ease with which electrons are injected, and a hole or electron transporting ability represented by its mobility may be different. However, it is preferred that the light emission layer has a function of transporting at least one of the holes and electrons.

Light emission materials used in the light emission layer are not specifically limited, and known materials used in the conventional organic EL element can be used. Such a light emission material is mainly an organic compound, and examples of the organic compound include compounds disclosed on pages 17 through 26 in "Macromol. Symp.", vol. 125, according to desired color tones.

The light emission materials may have a hole injecting function or a electron injecting function, in addition to the light emission function. Most of hole injecting materials or electron injecting materials can be also used as the light emission materials.

The light emission materials may be a polymer such as p-polyphenylenevinylene or polyfluorene, and a polymer in which the above light emission material is incorporated in the polymer side chain or in the polymer main chain.

The light emission layer may contain a dopant (a guest substance), and as the dopant can be used a compound selected from the known dopants used in the conventional El element.

Examples of the dopant include quinacridone, DCM, coumarin derivatives, rubrene, decacylene, pyrazoline derivatives, squalirium derivatives and europium complexes. Further, examples of the dopant include iridium complexes (for example, those disclosed in Japanese Patent O.P.I. Publication No. 2001-248759 or compounds represented by formulas on pages 16 through 18 of WO 0070655, for example, tris(2-phenylpyridine)iridium etc.), osmium complexes or platinum complexes, for example, 2,3,7,8,12, 13,17,18-octaethyl-21H,23H-porphyrin platinum complex.

As methods of forming a light emission layer employing the compounds mentioned above, there are known methods for forming a thin layer such as a deposition method, a spin-coat method, a casting method and an LB method. The light emission layer is preferably a molecular deposit layer. The molecular deposit layer herein refers to a layer formed by deposition of the above compounds in a gaseous state, or by solidification of the above compounds in a melted state or a liquefied state. The molecular deposit layer is distinguished from a thin layer (molecular cumulation layer) formed by an LB method in structure, for example, an aggregated structure or a higher order structure, or in function. The function difference results from the structural difference between them.

Further, the light emission layer can be formed by the method such as that described in Japanese Patent O.P.I. Publication No. 57-51781, in which the above light emission material is dissolved in a solvent together with a binder such as a resin, and the thus obtained solution is coated on a base to form a thin layer by a method such as a spin-coat method. The thickness of the thus formed light emission layer is not specially limited, and is optionally selected, but the thickness is ordinarily within the range of from 5 nm to 5 µm.

The hole injecting material for the hole injecting layer may be either an organic substance or an inorganic substance as long as it has a hole injecting ability or an ability to form a barrier to electron. Examples of the hole injecting material include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer. As the hole injecting material, those described above can be used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)-phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4"-tris[N-(3-methylphenyl)-N-phenylamino]-triphenylamine (MTDATA) in which three triphenylamine units are bonded in a starburst form.

As the hole injecting material, inorganic compounds such as p-Si and p-SiC are usable. The hole injecting layer can be formed layering the hole injecting material described above according to a known method such as a vacuum deposition method, a spin coat method, a casting method, an ink jet method, and an LB method. The thickness of the hole injecting layer is not specifically limited, but is ordinarily from 5 nm to 5 µm. The hole injecting layer may be composed of a single layer comprising one, or two or more of the materials mentioned above, or of plural layers the composition of which may be the same or different.

The electron injecting layer may be a layer having a function of transporting electrons injected to the cathode to the light emission layer. The material for the electron injecting layer may be selected from known compounds. Examples of the material used in the electron injecting layer (hereinafter referred to also as electron injecting material) include a nitro-substituted fluorene derivative, a diphenylquinone derivative, a thiopyran dioxide derivative, a tetracarboxylic acid anhydride such as naphthalene tetracarboxylic acid anhydride or perylene tetracarboxylic acid anhydride, a carbodiimide, a fluolenylidenemethane derivative, an anthraquinodimethane an anthrone derivative, and an oxadiazole derivative. Various electron transporting compounds described in Japanese Patent O.P.I. Publication No. 59-194393 is disclosed as compounds for forming a light emission, but it has been proved that these can be also used as the electron injecting material. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron injecting material. A metal complex of an 8-quinolinol derivative such as tris(8-quinolinolato)aluminum ($Alq_3$), tris(5,7-dichloro-8-quinolinolato)aluminum, tris(5,7-dibromo-8-quinolinolato)aluminum, tris(2-methyl-8-quinolinolato)aluminum, tris(5-methyl-8-quinolinolato)aluminum, or bis(8-quinolinolato)zinc ($Znq_2$), and a metal complex formed by replacing the center metal of the foregoing complexes with another metal atom such as In, Mg, Cu, Ca, Sn, Ga or Pb can be used as the electron injecting material. Furthermore, a metal free or metal-containing phthalocyanine, and a derivative thereof, in which the molecular terminal is replaced by a substituent such as an alkyl group or a sulfonic acid group, are also preferably used as the electron injecting material. The distyrylpyrazine derivative exemplified as a material for a light emission layer may preferably be employed as the electron injecting material. An inorganic semiconductor such as n-Si and n-SiC may also be used as the electron injecting material in a similar way as in the hole injecting layer.

The electron injecting layer can be formed by layering the compounds described above by a known method such as a vacuum deposition method, a spin coat method, a casting method and an LB method. The thickness of the electron injecting layer is not specifically limited, but is ordinarily from 5 nm to 5 µm. The electron injecting layer may be composed of a single layer comprising one or two or more of the electron injecting material mentioned above, or of plural layers comprising the same composition or different composition.

A buffering layer (an electrode interface layer) may be provided between the anode and the light emission layer or the hole injecting layer, or between the cathode and the light emission layer or the electron injecting layer.

The buffering layer is a layer provided between the electrode and an organic layer in order to reduce the driving voltage or to improve of light emission efficiency. As the buffering layer there are an anode buffering layer and a cathode buffering layer, which are described in detail in "Electrode Material" page 123, Div. 2 Chapter 2 of "Organic EL element and its frontier of industrialization" (published by NTS Corporation, Nov. 30, 1998).

The anode buffering layer is described in detail in Japanese Patent O.P.I. Publication Nos. 9-45479, 9-260062, and 8-288069 etc., and its examples include a phthalocyanine buffering layer represented by a copper phthalocyanine layer, an oxide buffering layer represented by a vanadium oxide layer, an amorphous carbon buffering layer, a polymer buffering layer employing an electroconductive polymer such as polyaniline (emeraldine), and polythiophene, etc.

The cathode buffering layer is described in detail in Japanese Patent O.P.I. Publication Nos. 6-325871, 9-17574, and 9-74586, etc., and its examples include a metal buffering layer represented by a strontium or aluminum layer, an alkali metal compound buffering layer represented by a lithium fluoride layer, an alkali earth metal compound buffering layer represented by a magnesium fluoride layer, and an oxide buffering layer represented by an aluminum oxide.

The buffering layer is preferably very thin and has a thickness of preferably from 0.1 to 100 nm depending on kinds of the material used.

A layer having another function may be provided if necessary in addition to the fundamental component layers as described above, for example a hole blocking layer may be added as described in Japanese Patent O.P.I. Publication Nos. 11-204258, and 11-204359, and on page 237 of "Organic EL element and its frontier of industrialization" (published by NTS Corporation, Nov. 30, 1998).

At least one of the cathode buffering layer and anode buffering layer may contain the compound in the invention, and function as a light emission layer.

As the electrode material for the anode of the organic EL element, a metal, an alloy, or an electroconductive compound each having a high working function (not less than 4 eV), and mixture thereof are preferably used. Concrete examples of such an electrode material include a metal such as Au, and a transparent electroconductive material such as CuI, indium tin oxide (ITO), $SnO_2$, or ZnO.

As the anode, a thin layer of the electrode material described above is formed according to a depositing or sputtering method, in which the layer may be formed into a desired pattern according to photolithography, or in which when required precision of the pattern is not so high (not less than 100 μm), the layer may be formed into a desired pattern through a mask having the pattern. When light is emitted through the anode, the transmittance of the anode is preferably 10% or more, and the sheet resistivity of the anode is preferably not more than several hundred Ω/□. The thickness of the layer is ordinarily within the range of from 10 nm to 1 μm, and preferably from 10 to 200 nm, although it may vary due to kinds of materials used.

On the other hand, as the electrode material for the cathode of the organic EL element, a metal (also referred to as an electron injecting metal), an alloy, and an electroconductive compound each having a low working function (not more than 4 eV), and a mixture thereof is used. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal with a working function higher than that of the electron injecting metal, such as a magnesium/silver mixture, a magnesium/aluminum mixture, a magnesium/indium mixture, an aluminum/aluminum oxide ($Al_2O_3$) mixture or a lithium/aluminum mixture, is suitable from the view point of the electron injecting ability and resistance to oxidation. The cathode can be prepared forming a thin layer of such an electrode material according to a method such as a deposition or sputtering method. The sheet resistivity as the cathode is preferably not more than several hundred Ω/□, and the thickness of the cathode is ordinarily from 10 nm to 1 μm, and preferably from 50 to 200 nm. It is preferable in increasing the light emission efficiency that either the anode or the cathode of the organic EL element is transparent or semi-transparent.

Next, the suitable embodiment of the organic EL element of the invention, which comprises the structure anode/hole injecting layer/light emission layer/electron injecting layer/cathode and is sealed employing the support of the invention, will be explained.

Figure 9:
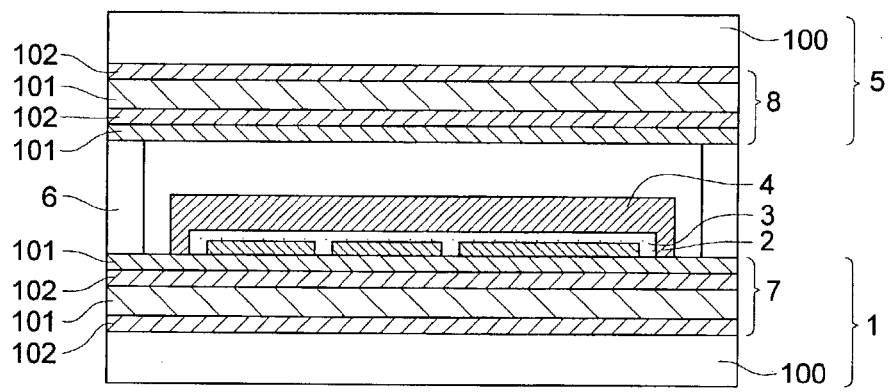
FIG. 9 shows a sectional view of one embodiment of the organic electroluminescence element of the invention.

FIG. 9 shows a sectional view of one embodiment of the EL element of the invention employing the support of the invention. The EL element has a transparent support 1 and a support 5 (hereinafter referred to also as counter support 5) opposed to the support 1. The support 1 is the support of the invention shown in FIG. 8, which comprises a plastic sheet substrate 100 comprised of a resin such as polyester, polyacrylate, polycarbonate, polysulfone, or polyetherketone, and provided thereon, a polymer layer and a sealing layer which have been formed by atmospheric pressure plasma discharge treatment.

An organic EL layer is provided on the support 1, and plural anodes 2 are provided in parallel with each other on the layer 101 of the support 1 comprising the sheet 100 and provided thereon, a polymer layer 102, a sealing layer 101, a polymer layer 102, and a sealing layer 101 in that order (laminate layer 7). A thin layer of a desired electrode material such as an anode material is formed by a deposition or sputtering method so that the thickness of the layer is not more than 1 μm, and preferably within the range of from 10 to 200 nm to prepare an anode 2. As the electrode material for the anode of the organic EL element are used a metal, an alloy or an electroconductive compound each having a high working function (not less than 4 eV), and a mixture thereof, for example, a metal such as Au and a transparent electroconductive material such as CuI, indium tin oxide (ITO), indium zinc oxide (IZO), $SnO_2$ or ZnO.

Next, an organic EL layer 3 is formed on the anode 2, wherein although not illustrated, a hole injecting layer, a light emission layer, and an electron injecting layer are formed on the anode, employing the materials as described above.

Subsequently, a thin layer of a cathode material selected from the materials described above is formed by a deposition or sputtering method to prepare a cathode 4 on the organic EL layer 3. As described above, it is preferable in increasing the light emission efficiency that either the anode or the cathode of the organic EL element be transparent or semi-transparent.

For formation of each layer of the organic EL element 3, a vacuum deposition method is preferably used even though a spin coating method, a casting method and a deposition method can be used. The vacuum deposition method is preferable since a uniform layer can be formed and a pinhole is formed with difficulty. Although conditions of the vacuum deposition are different due to kinds of materials used or due to an intended crystalline or association structure of the molecular deposition layer, the vacuum deposition is preferably carried out at a boat temperature of from 50° C. to 450° C., at a vacuum degree of from $10^{-6}$ to $10^{-3}$ Pa, at a deposition speed of from 0.01 to 50 nm/second, and at a substrate temperature of from −50 to 300° C., to form a layer thickness of from 5 nm to 5 μm.

After formation of these layers, a thin layer of a material for cathode is provided thereon by, for example, a deposition method or sputtering method so that the thickness is not more than 1 μm, and preferably from 50 to 200 nm, to form a cathode. Thus a desired organic EL element is obtained.

It is preferred that the layers from the hole injecting layer to the cathode are continuously formed under one time of vacuuming to prepare the organic EL element. Further, the organic EL element can be prepared in the reverse order, in which the cathode, the electron injecting layer, the light emission layer, hole injecting layer, and the anode are formed in that order. Light emission can be observed when a direct current with a voltage of from about 5 to 40 V is applied to the thus prepared organic EL element so that the polarity of the anode is positive and that of the cathode is negative. When the voltage is applied in the reverse polarity, no current is generated and light is not emitted at all. When an alternating voltage is applied, light is emitted only when the polarity of the anode is positive and that of the cathode is negative. The shape of the wave of the alternating current may be optionally selected.

A protective layer may be provided on the surface of the organic EL layer 3 including the cathode 4. The inorganic protective layer is comprised of for example, a dispersion in which $SiO_2$ is dispersed in $CeO_2$. The inorganic protective layer may be formed according to a sputtering method, an ion plating method, or a deposition method. The thickness of the inorganic protective layer is 0.1 to 10000 Å, and preferably 50 to 1000 Å. After the cathode 4 is formed on the organic EL layer, the inorganic protective layer is successively formed on the cathode under vacuum, which is not taken out from a vacuum chamber, or after the cathode 4 is formed on the organic EL layer, the resulting material is removed from a vacuum chamber, transported in a nitrogen or inert gas atmosphere, and then the inorganic protective layer is formed on the cathode under vacuum.

The organic EL layer 3 including cathode 4 is covered with a support 5 as a counter support, comprising a substrate 100 and a laminate layer 8 comprised of a polymer layer 102, a sealing layer 101, a polymer layer 102, and a sealing layer 101 provided on the substrate in that order, and sealed.

The sealing is carried out as follows. A sealing agent layer is provided in the frame form on the peripheral portions of the surface of the counter support 5 (the surface facing the transparent support 1) through a coating method or a transfer method, and the counter support 5 is adhered to the transparent support 1 through the sealing agent layer. Examples of the sealing agent include a heat curable epoxy resin, a photo curable epoxy resin and an epoxy resin comprising a micro-encapsulated initiator capable of being hardened at ordinary temperature by application of pressure. In this case, openings (not illustrated) for exhausting air are provided at specific portions of the sealing agent layer to complete the sealing. The openings are closed with the above epoxy resins or a UV hardenable resin under reduced pressure (at a pressure of preferably not more than $1.33 \times 10^{-2}$ Mpa) or under a nitrogen gas or inert gas atmosphere.

The above epoxy resin comprises, as a main component, a resin of bisphenol A type, bisphenol F type, bisphenol AD type, bisphenol S type, xylenol type, phenol novolak type, cresol novolak type, polyfunctional type, tetraphenyrolmethane type, polyethylene glycol type, polypropylene glycol type, hexane diol type, trimethylol propane type, propylene oxide bisphenol A type, hydrogenated bisphenol A type, or their mixture type. When a sealing agent 6 is formed by transfer, a sealing agent is preferably in the film form.

The counter substrate 100 may be comprised of glass, resin, ceramic, metal, a metal compound, or their composite. The counter substrate is preferably a substrate with a thickness of not less than 1 μm having a water vapor penetration of not less than 1 $g/m^2 \cdot 1$ atm·24 hr (at 25° C.) in the test carried out according to JIS Z-0208. Such a substrate may be used as the counter substrate.

In the invention, a material (for example, barium oxide) absorbing or reacting with moisture can be enclosed in the above support.

In the organic EL element as described above, the transparent support 1 is adhered to the counter support 5 through a sealing material 6 in the frame form. The organic El element provided on the transparent support 1 and cathode 4, etc. can be covered with the counter support 5 and the sealing material 6. Accordingly, the light emission layer can be enclosed at low humidity in the organic El element, and penetration of moisture through the support can be restrained, whereby the organic EL display can be obtained in which humidity resistance is improved and generation or growth of dark spots is restrained.

Figure 10:
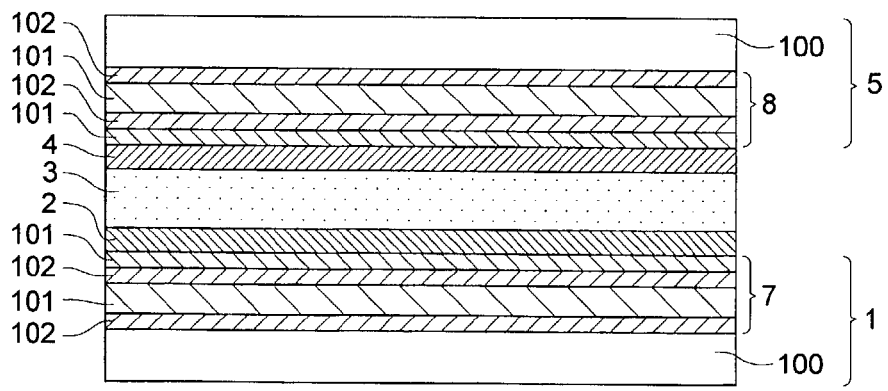
FIG. 10 shows a schematic view of another embodiment of the organic EL element of the invention.

FIG. 10 shows a schematic view of another embodiment of the organic EL element of the invention. The numerical numbers shown in FIG. 10 mean the same as in FIG. 9.

Figure 11:
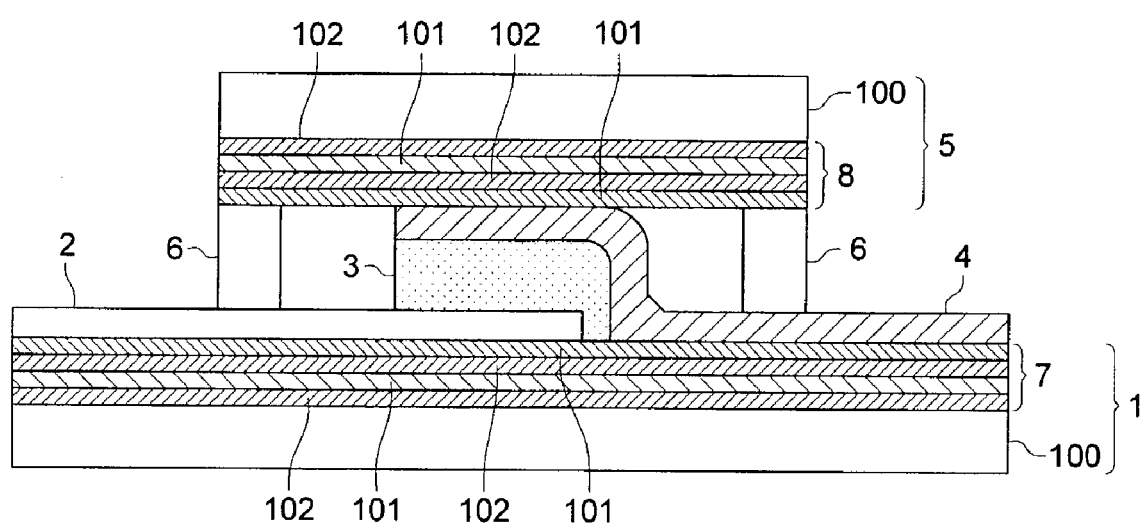
FIG. 11 shows a schematic view of still another embodiment of the organic electroluminescence element of the invention.

FIG. 11 shows a schematic view of still another embodiment of the organic EL element of the invention employing the support of the invention. The numerical numbers shown in FIG. 11 mean the same as in FIG. 9.

The constitutions of the support and the organic EL element described above are the embodiments of the present invention, but the present invention is not limited thereto.

EXAMPLES

The present invention will be explained in the following examples, but is not limited thereto.

Example 1

(Preparation of Support A of the Invention)

A methyl methacrylate-vinyl acetate copolymer layer as a polymer layer and an alumina layer as a sealing layer (metal oxide layer) were formed on a 100 μm thick PET (polyethylene terephthalate) film substrate, employing a plasma layer formation apparatus as shown in FIG. 1, so that four layers, i.e., a first polymer layer, a first sealing layer (aluminum oxide layer), a second polymer layer, and a second sealing layer (aluminum oxide layer) were formed on the substrate in that order. Thus, support A was obtained.

Herein, the gas used and power supplied were as follows:

| (Preparation of polymer layer) Composition of mixed gas used | |
|---|---|
| Inert gas: argon | 99% by volume |
| Reactive gas: methyl methacrylate (gasified by bubbled with argon at 90° C.) | 0.5% by volume |
| Reactive gas: vinyl acetate (gasified by bubbled with argon at 60° C.) | 0.5% by volume |

Power Supplied:

A power of 5 W/cm$^2$ with a frequency of 100 kHz was supplied.

| (Preparation of sealing layer) Composition of mixed gas used | |
|---|---|
| Inert gas: argon | 98.75% by volume |
| Reactive gas: oxygen | 1.0% by volume |
| Reactive gas: Aluminum isopropoxide (gasified by bubbled with argon at 160° C.) | 0.25% by volume |

Power Supplied:

A power of 5 W/cm$^2$ with a frequency of 13.56 MHz was supplied.

Example 2

(Preparation of Support B of the Invention)

Support B was obtained in the same manner as in Example 1, except that six layers, a first polymer layer, a first sealing layer (aluminum oxide layer), a second polymer layer, a second sealing layer (aluminum oxide layer), a third polymer layer, and a third sealing layer (aluminum oxide layer) were formed on the PET film substrate in that order.

Example 3

(Preparation of Support C of the Invention)

Support C was obtained in the same manner as in Example 1, except that ten layers, a first polymer layer, a first sealing layer (aluminum oxide layer), a second polymer layer, a second sealing layer (aluminum oxide layer), a third polymer layer, a third sealing layer (aluminum oxide layer), a fourth polymer layer, a fourth sealing layer (aluminum oxide layer), a fifth polymer layer, and a fifth sealing layer (aluminum oxide layer) were formed on the PET film substrate in that order.

Comparative Example 1

A 1% methyl methacrylate THF solution is spin coated on a PET film (with a thickness of 100 μm) with a size of 100 mm×100 mm, dried, and subjected to UV lamp exposure to form a polymer layer with a thickness of 200 nm on the film. Subsequently, the resulting film was fixed in a holder of a vacuum deposition apparatus available on the market, and after that, pressure in the vacuum chamber of the apparatus was reduced to 2×10$^{-4}$ Pa. Then, a sealing layer (an aluminum oxide layer) was vacuum deposited on the polymer layer to give a thickness of 200 nm.

The process forming two layers described above was repeated two times. Thus, support D (comparative) was obtained.

The process forming two layers described above was repeated three times, employing another PET film. Thus, support E (comparative) was obtained.

The process forming two layers described above was repeated five times, employing another PET film. Thus, support E (comparative) was obtained.

(Peeling Test)

Cross cut test as described in JIS K5400 was carried out. Eleven lines were cut at an interval of 1 mm in the transverse and longitudinal directions on the layer surface with a single-edged blade normal to the layer surface to form one hundred 1 mm square grids. Then, cellophane adhesive tape available on the market was applied to the grid surface, and the tape, with one edge unattached, was sharply peeled away from the surface at an angle of 90°. The rate of the area of the peeled layer to the area of the adhered tape was calculated, and evaluation was carried out according to the following criteria.

A: The rate of the area of the peeled layer to the area of the adhered tape was from 0% to less than 0.5%.

B: The rate of the area of the peeled layer to the area of the adhered tape was from 0.5% to less than 10%.

C: The rate of the area of the peeled layer to the area of the adhered tape was not less than 10%.

The results are shown in Table 1.

TABLE 1

| Support | Peeling test | Remarks |
|---|---|---|
| A | A | Inventive |
| B | A | Inventive |
| C | A | Inventive |
| D | B | Comparative |
| E | B | Comparative |
| F | B | Comparative |

The inventive samples prepared according to the atmospheric pressure plasma method exhibited good result in the peeling test, compared with the comparative samples. This is considered to be due to the reason that the inventive samples had a more flexible layer as compared to the comparative samples.

[Preparation of Organic EL Element Employing the Support of the Invention]

FIG. 11 is a sectional view showing the constitution of the organic EL element prepared. A transparent conductive layer, an IZO (indium zinc oxide) layer was formed on the silicon oxide layer of the support A (of the invention) prepared above as a transparent support according to a DC magnetron sputtering method, employing, as a sputtering target, a sintering substance comprised of a mixture of indium oxide and zinc oxide (In/(In+Zn)=0.80 by mole). Pressure in the vacuum chamber of the sputtering apparatus was reduced to 1×10$^{-3}$ Pa, then a mixed gas of an argon gas and an oxygen gas (argon:oxygen=1000:2.8 by volume) was introduced until pressure in the vacuum chamber reached not more than 1×10$^{-1}$ Pa, and the transparent IZO (indium zinc oxide) conductive layer was formed at a target voltage of 420 V at a support temperature of 60° C. according to the DC magnetron method to obtain a thickness of 250 nm. The resulting IZO layer was subjected to patterning to form an anode, and subjected to ultrasonic washing in isopropyl alcohol, dried with a nitrogen gas, and further subjected to UV-ozone cleaning for 5 minutes.

An a-NPD layer with a thickness of 25 nm, a CBP and Ir(ppy)$_3$ co-disposition layer with a thickness of 35 nm (a disposition speed ratio of CBP to Ir(ppy)$_3$ being 100:6), a BC layer with a thickness of 10 nm, and an Alq$_3$ layer with a thickness of 40 nm were formed as an organic EL layer in that order on the transparent conductive layer and further, a lithium fluoride layer with a thickness of 0.5 nm was formed on the Alq$_3$ layer as cathode buffering layer (not illustrated in detail in FIG. 11). Further, a 100 nm thick cathode of aluminum was formed on the lithium fluoride layer through a mask pattern.

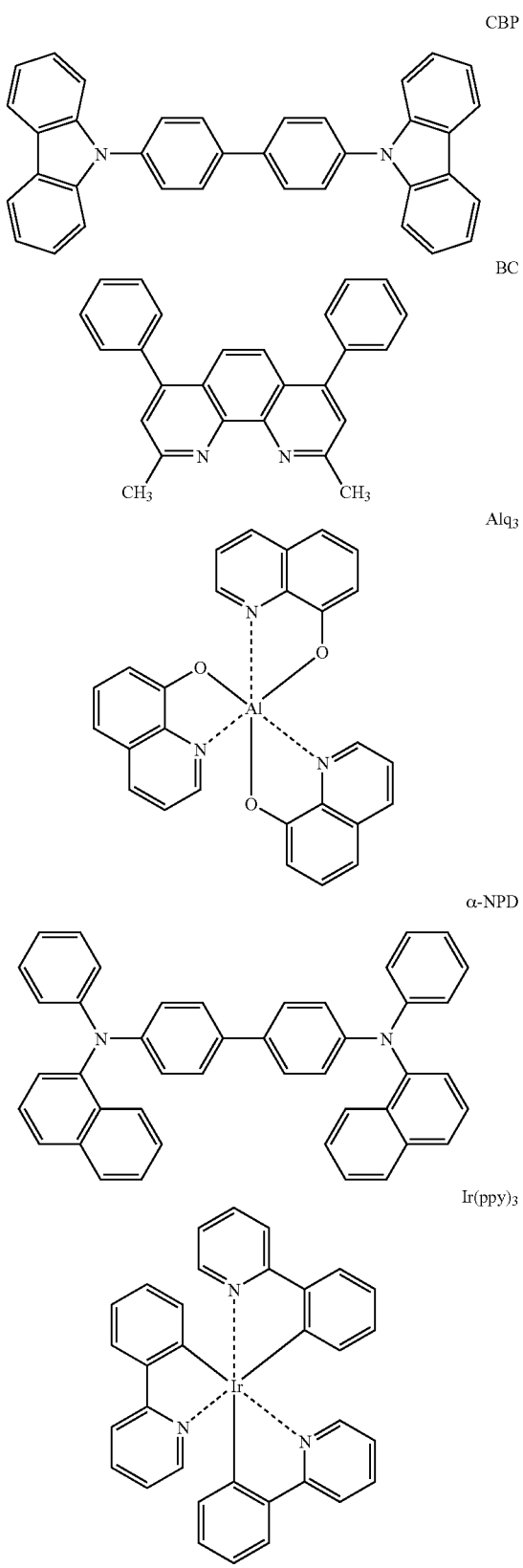

The support A (as the support 5 of FIG. 11) was superposed on the cathode of the thus obtained laminate under a nitrogen atmosphere. Thus an organic EL element sample OLED-1 was prepared. FIG. 11 shows the structure in that the transparent electrode and the aluminum cathode were sealed employing a photo-curable epoxy resin adhesive and a part of the transparent electrode and a part of the aluminum cathode can be used as electrical terminals.

Organic EL element samples OLED-2, 3, 4, 5, and 6 were prepared in the same manner as in organic EL element sample OLED-1 of Example 1, except that supports B, C, D, E and F were used, respectively, instead of support A.

The light emission layer of each of the above-obtained organic EL element samples was evaluated as follows.

Nine volts were applied to each sample, and the light emitted portion was photographed at a factor of 50 power to obtain a first photographic image of the light emitted portion. Further, each sample was subjected to folding test in which the sample was folded by an angle of 45°, and returned to the original position, which was repeated 1000 times, and then the sample was aged for 100 hours at 50° C. and 80% RH. Then, nine volts were applied to the resulting sample, and the light emitted portion was photographed at a factor of 50 power to obtain a second photographic image of the light emitted portion. The areas of dark spots in the first and second photographic images were measured, and the dark spot area increase rate defined by the following formula was calculated.

Dark spot area increase rate (%)=(Dark spot area in the second photographic image−Dark spot area in the first photographic image)×100/Dark spot area in the first photographic image The dark spot area increase rate obtained above was evaluated according to the following criteria:

E: The dark spot area increase rate was not less than 20%.
D: The dark spot area increase rate was from 15% to less than 20%.
C: The dark spot area increase rate was from 10% to less than 15%.
B: The dark spot area increase rate was from 5% to less than 10%.
A: The dark spot area increase rate was less than 5%.

The results are shown in Table 2.

TABLE 2

| Organic EL element sample | Support used | Dark spot area increase rate | Remarks |
|---|---|---|---|
| OLED-1 | A | C | Inventive |
| OLED-2 | B | B | Inventive |
| OLED-3 | C | A | Inventive |
| OLED-4 | D | E | Comparative |
| OLED-5 | E | D | Comparative |
| OLED-6 | F | D | Comparative |

As is apparent from Table 2, organic EL element samples OLED-4, 5 and 6 (comparative samples), employing comparative supports D, E and F, respectively, exhibited poor results in the folding test. This is considered to be due to the reason that cracks, produced in the layer by the folding test, could not prevent moisture in air from penetrating into the layer of the samples. Inventive organic EL element samples employing inventive supports A, B or C exhibited minimized deterioration due to folding test, and provided excellent resistance to folding, which were proved to be suitable for flexible displays.

Example 4

A silicon oxide layer was formed on a 100 μm thick polyethylene terephthalate film, and supports described later were prepared according to the procedures as described below. Formation of the silicon oxide layer according to an atmospheric pressure plasma CVD method was carried out employing the plasma layer formation apparatus as shown in FIG. 1.

Formation of a silicon oxide layer having a carbon concentration of 3 atomic % was carried out employing the gas composition used and power supplied as shown below (hereinafter referred to as Condition A).

| Composition of gas used | |
|---|---|
| Inert gas: argon | 98.25% by volume |
| Reactive gas 1: hydrogen | 1.5% by volume |
| Reactive gas 2: tetraethoxysilane vapor (gasified by being bubbled with argon) | 0.25% by volume |

Power Supplied:

A power of 1 W/cm$^2$ with a frequency of 13.56 MHz was supplied.

Formation of a silicon oxide layer having a carbon concentration of 0.01 atomic % was carried out employing the gas composition used and power supplied as shown below (hereinafter referred to as Condition B).

Composition of Gas Used

The same gas composition as in Condition A above was used.

Power Supplied:

A power of 10 W/cm$^2$ with a frequency of 13.56 MHz was supplied.

The carbon concentration in the silicon oxide layer of each of the supports described below was determined employing a dynamic secondary ion-mass spectrography (hereinafter referred to also as dynamic SIMS). Regarding the dynamic secondary ion-mass spectrography (dynamic SIMS), JITSUYO HYOMEN BUNSEKI NIJIION SIT-SURYO BUNSEKI edited by HYOMEN KAGAKUKAI (2001, MARUZEN) is referred to. In the invention, dynamic SIMS measurement was carried out under conditions as shown below.

Spectrometer used: ADEPT 1010 produced by Physical Electronics Co., Ltd. or TYPE 6300 secondary ion mass spectrometer

| | |
|---|---|
| Primary ion used: | Cs |
| Primary ion energy: | 5.0 KeV |
| Primary ion current: | 200 nA |
| Area radiated by primary ion: | 600 μm square |
| Absorption rate of secondary ion: | 25% |
| Secondary ion polarity: | Negative |
| Secondary ion to be detected: | C$^-$ |

The carbon concentration in the silicon oxide layer is determined under the conditions as described above. Firstly, based on the carbon concentration of a standard silicon oxide layer, which is determined according to a Rutherford back scattering spectrography, and intensity of the carbon ion of the standard silicon oxide layer obtained according to the dynamic SIMS, relative sensitivity coefficient is obtained. Next, based on the intensity of the carbon ion of a silicon oxide layer of a sample to be measured obtained according to the dynamic SIMS and the relative sensitivity coefficient obtained above, the carbon concentration of the sample is computed. In the invention, the carbon concentration of the silicon oxide layer is measured through the entire thickness thereof to obtain a depth profile of the carbon concentration. Carbon concentrations are obtained at portions from 15 to 85% of the thickness from the depth profile obtained above, and the average thereof is defined as the carbon concentration in the invention. Thus, the carbon concentration of the silicon dioxide layer is obtained in terms of atomic % as represented by the following formula:

Carbon concentration (atomic %) in the silicon oxide layer=(Number of carbon atoms)×100/(Number of all atoms)

(Preparation of Support G)

A silicon oxide layer was formed on a 100 μm thick polyethylene terephthalate film according to an RF sputtering method (frequency: 13.56 MHz) employing silicon oxide as a sputtering target to obtain a thickness of 880 nm. Thus, comparative support G was obtained.

The carbon concentration of the formed silicon oxide layer was less than the lowest limit capable of being detected according to the method described above.

(Preparation of Support H)

A silicon oxide layer was formed on a 100 μm thick polyethylene terephthalate film according to an atmospheric pressure plasma CVD method employing the condition A described above to obtain a thickness of 880 nm. Thus, support H was obtained.

(Preparation of Support I)

A silicon oxide layer was formed on a 100 μm thick polyethylene terephthalate film according to an atmospheric pressure plasma CVD method employing the condition B described above to obtain a thickness of 880 nm. Thus, support I was obtained.

(Preparation of Support J)

A first silicon oxide layer was formed on a 100 μm thick polyethylene terephthalate film employing the condition A described above to obtain a thickness of 220 nm, a second silicon oxide layer was formed on the first layer employing the condition B described above to obtain a thickness of 220 nm, a third silicon oxide layer was formed on the second layer employing the condition A described above to obtain a thickness of 220 nm, and a fourth silicon oxide layer was formed on the third layer employing the condition B described above to obtain a thickness of 220 nm. Thus, support J having four silicon oxide layers was obtained.

(Preparation of Support K)

A fifth silicon oxide layer was formed on the fourth silicon oxide layer of the support J obtained above, employing the condition A, to obtain a thickness of 220 nm, and a sixth silicon oxide layer was formed on the fifth silicon oxide layer employing the condition B to obtain a thickness of 220 nm. Thus, support K having six silicon oxide layers was obtained.

Organic EL element samples OLED-7, 8, 9, 10, and 11 were prepared in the same manner as in organic EL element sample OLED-1 of Example 1, except that supports G, H, I, J and K were used, respectively, instead of support A.

When DC 9 volts are applied to these organic EL element samples, green light was emitted. The luminance half-life of light emitted from the organic EL element samples OLED-8, 9, 10, and 11 was expressed by a relative value (hereinafter referred to also as relative luminance half-life) when the luminance half-life of light emitted from the sample OLED-7 was set at 100. The results are as follows:
OLED-8 (123), OLED-9 (142), OLED-10 (425), OLED-11 (641)

The value in the parenthesis represents the relative luminance half-life.

As is apparent from the above, organic EL element samples employing the supports of the invention provided long lifetime.

EFFECTS OF THE INVENTION

The present invention can provide a support with high moisture sealing property and without layer exfoliation, which is useful as a display or an electronic device, and an organic electroluminescence element with long life employing the supports.

What is claimed is:

1. A support comprising a flexible substrate and provided thereon, one or two or more polymer layers containing a polymeric compound and one or two or more sealing layers containing a metal oxide, a metal nitride or a metal oxide nitride, wherein at least one of the polymer layers and the sealing layers is formed by a process comprising exciting a reactive gas at a space between opposed electrodes at atmospheric pressure or approximately atmospheric pressure by electric discharge to be in the plasma state, and exposing the flexible substrate, the polymer layer, or the sealing layer to the reactive gas in the plasma state, and wherein the polymeric compound is obtained by polymerization of a monomer comprising a vinyl compound or an acetylene compound, the metal oxide is a compound selected from silicon oxide, titanium oxide, indium oxide, tin oxide, indium tin oxide (ITO), or alumina, the metal nitride is a compound selected from silicon nitride or titanium nitride, the metal oxide nitride is a compound selected from silicon oxide nitride, or titanium oxide nitride, and the reactive gas is an organometallic compound or the monomer, and wherein the sealing layer contains carbon in an amount of from 0.2 to 5% by weight.

2. The support of claim 1, wherein the organometallic compound is an organosilicon compound, an organotitanium compound, an organotin compound, an organoindium compound, an organoaluminum compound, or a composite compound thereof.

3. The support of claim 2, wherein the organosilicon compound is a compound represented by formula (1), (2), (3), or (4),

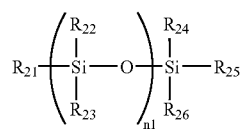

Formula (1)

wherein $R_{21}$, $R_{22}$, $R_{23}$, $R_{24}$, $R_{25}$ and $R_{26}$ independently represent a hydrogen atom or a monovalent substituent, and n1 represents a natural number,

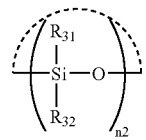

Formula (2)

wherein $R_{31}$ and $R_{32}$ independently represent a hydrogen atom or a monovalent substituent, and n2 represents a natural number, Formula (3)

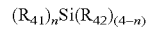

$(R_{41})_n Si(R_{42})_{(4-n)}$ wherein $R_{41}$ and $R_{42}$ independently represent a hydrogen atom or a monovalent substituent, and n represents an integer of from 0 to 3,

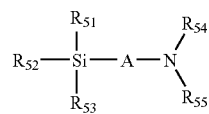

Formula (4)

wherein A represents a single bond or a divalent group, $R_{51}$, $R_{52}$, $R_{53}$, $R_{54}$, and $R_{55}$ independently represent a hydrogen atom, a halogen atom, an allyl group, a cycloalkyl group, an alkenyl group, an aryl group, an aromatic heterocyclic group, an amino group or a cyano group, provided that $R_{51}$ and $R_{52}$, or $R_{54}$ and $R_{55}$ may combine with each other to form a ring.

4. The support of claim 3, wherein the compound represented by formula (4) is a compound represented by formula (5),

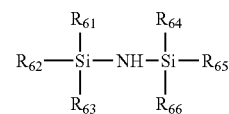

Formula (5)

wherein $R_{61}$, $R_{62}$, $R_{63}$, $R_{64}$, $R_{65}$, and $R_{66}$ independently represent a hydrogen atom, a halogen atom, an alkyl group, a cycloalkyl group, an alkenyl group, an aryl group, or an aromatic heterocyclic group.

5. The support of claim 1, wherein the content of the metal oxide, the metal nitride and/or the metal oxide nitride in the sealing layer is not less than 90% by weight.

6. The support of claim 1, wherein the sealing layer has a thickness of from 50 to 2000 nm, and the polymer layer has a thickness of from 50 to 2000 nm.

* * * * *